(12) United States Patent
Pan et al.

(10) Patent No.: US 9,548,103 B1
(45) Date of Patent: *Jan. 17, 2017

(54) SCALEABLE LOOK-UP TABLE BASED MEMORY

(71) Applicant: Altera Corporation, San Jose, CA (US)

(72) Inventors: Philip Pan, Fremont, CA (US); Andy L. Lee, San Jose, CA (US); Lu Zhou, Santa Clara, CA (US); Aniket Kadkol, Cupertino, CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/806,962

(22) Filed: Jul. 23, 2015

Related U.S. Application Data

(60) Continuation of application No. 14/145,090, filed on Dec. 31, 2013, now Pat. No. 9,123,437, which is a continuation of application No. 13/277,871, filed on Oct. 20, 2011, now Pat. No. 8,644,100, which is a division of application No. 12/136,201, filed on Jun. 10, 2008, now Pat. No. 8,064,280.

(51) Int. Cl.
| | |
|---|---|
| G11C 7/00 | (2006.01) |
| G11C 11/418 | (2006.01) |
| G11C 7/10 | (2006.01) |
| G11C 11/419 | (2006.01) |
| G11C 7/22 | (2006.01) |
| G11C 7/12 | (2006.01) |
| G11C 11/4094 | (2006.01) |

(52) U.S. Cl.
CPC .............. *G11C 11/418* (2013.01); *G11C 7/00* (2013.01); *G11C 7/1048* (2013.01); *G11C 7/12* (2013.01); *G11C 7/22* (2013.01); *G11C 11/419* (2013.01); *G11C 11/4094* (2013.01)

(58) Field of Classification Search
CPC .. G11C 11/418; G11C 11/419; G11C 11/4094; G11C 7/00; G11C 7/12; G11C 7/22; G11C 7/1048
USPC ........................................ 365/203, 226, 228
See application file for complete search history.

(56) References Cited

U.S. PATENT DOCUMENTS

| | | | |
|---|---|---|---|
| 5,790,138 A | 8/1998 | Hsu | |
| 5,996,042 A | 11/1999 | Pawlowski et al. | |
| 6,286,114 B1 * | 9/2001 | Veenstra | G01R 31/3177 703/16 |
| 6,434,076 B1 | 8/2002 | Andersen et al. | |
| 6,519,707 B2 | 2/2003 | Clark et al. | |
| 6,724,648 B2 | 4/2004 | Khellah et al. | |
| 6,829,183 B2 | 12/2004 | Braceras | |

(Continued)

*Primary Examiner* — Pho M Luu
(74) *Attorney, Agent, or Firm* — Fletcher Yoder, P.C.

(57) ABSTRACT

An integrated circuit having a logic element that includes an array of storage elements convertibly functioning as either a configuration random access memory (CRAM) or a static random access memory (SRAM) is provided. The logic element includes first and second pairs of data paths having dedicated multiplexers. In one embodiment, the first and second pairs of data paths are multiplexed into bit lines of a row of the array. The logic element also includes a data path control block generating control signals for each of the dedicated multiplexers. The control signals determine whether the storage elements function as a CRAM or a SRAM. A method for selectively configuring a memory array between a CRAM mode and SRAM mode are provided.

20 Claims, 6 Drawing Sheets

(56) References Cited

U.S. PATENT DOCUMENTS

| | | | |
|---|---|---|---|
| 6,922,370 B2 | 7/2005 | Deng et al. | |
| 6,938,142 B2 | 8/2005 | Pawlowski | |
| 7,474,582 B2 | 1/2009 | Mair et al. | |
| 7,506,192 B2 | 3/2009 | Ma | |
| 8,064,280 B1 * | 11/2011 | Pan | G11C 7/1045 365/185.09 |
| 8,108,729 B2 * | 1/2012 | Brunot | G06F 17/5022 714/29 |
| 8,487,665 B2 * | 7/2013 | Wang | H03K 19/017581 326/82 |
| 8,644,100 B2 * | 2/2014 | Pan | G11C 7/1045 365/203 |
| 9,123,437 B1 * | 9/2015 | Pan | G11C 7/1045 |

* cited by examiner

SCALEABLE LOOK-UP TABLE BASED MEMORY

CROSS REFERENCE TO RELATED APPLICATIONS

This is a continuation of copending, commonly-assigned U.S. patent application Ser. No. 14/145,090, filed Dec. 31, 2013, now U.S. Pat. No. 9,123,437, which was a continuation of commonly-assigned U.S. patent application Ser. No. 13/277,871, filed Oct. 20, 2011, now U.S. Pat. No. 8,644,100, which was a division of commonly-assigned U.S. patent application Ser. No. 12/136,201, filed Jun. 10, 2008, now U.S. Pat. No. 8,064,280, the disclosure of which is incorporated herein by reference in its entirety.

BACKGROUND

The present invention relates to the field of integrated circuits and in particular to programmable devices having convertible storage elements. In programmable devices, such as programmable logic devices (PLD), one type of random access memory is used to store configuration data of the PLD, this type of memory is often referred to as a configuration random access memory (CRAM). Each CRAM stores a pre-defined bit or information for a static task. Depending on the combination of multiple CRAMs, a PLD is able to work differently by using the same hardware. One skilled in the art will appreciate that the CRAM is loaded during the start-up operation of the PLD. The start-up operation where the CRAM is loaded, which may be referred to as a configuration mode, typically occurs between the chip power on and the user operation. Once the CRAM is loaded, the contents cannot be changed.

Despite the success of programmable logic, there is a continuing desire to provide greater functionality in a programmable logic device, and at the same time, to provide greater flexibility. There is also a need to provide higher performance user memories also. Currently, the memories for a programmable logic device are typically pre-defined in size and these pre-defined memories are used under restrictions. Thus, the restrictions limit the flexibility of using the memories, e.g., when a portion of the programmable logic device that contains the memory, or combinational logic that includes memory is unused, the memory remains unused.

Accordingly, there is a need for a highly flexible memory, which may be selectively configured between combinational logic functions and memory functions within a programmable logic device.

SUMMARY

Embodiments of the present invention provide a method and a framework for configuring the memories within a programmable logic device to meet customer demands for greater flexibility. It should be appreciated that the present invention can be implemented in numerous ways, such as a process, an apparatus, a system, a device or a method on a computer readable medium. Several inventive embodiments of the present invention are described below.

In one aspect of the invention, an integrated circuit having a logic element that includes an array of storage elements convertibly functioning as either a configuration random access memory (CRAM) or a static random access memory (SRAM). The logic element includes first and second pairs of data paths having dedicated multiplexers. In one embodiment, the first and second pairs of data paths are multiplexed into bit lines of a row of the array. The logic element also includes a data path control block generating control signals for each of the dedicated multiplexers. The control signals determine whether the storage elements function as a CRAM or a SRAM.

In another aspect, a method for selectively configuring memory elements of a memory array of an integrated circuit is provided. The method includes providing first and second pairs of data lines into each row of the memory array. Data from either the first or second pairs of data lines is selected for accessing corresponding bit lines of a row of the memory array. An error check is performed through one of the data lines of the first pair of data lines for data accessing the memory array.

Other aspects of the invention will becomes apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Embodiments of the present invention provide a method and a framework for configuring the memories within a programmable logic device to meet customer demands for greater flexibility. The ratio of memory to logic may also be adjusted through the embodiments described herein so as to enhance the flexibility of the device. It will be obvious, however, to one skilled in the art, that the present invention may be practiced without some or all of these specific details. In other instances, well known process operations have not been described in detail in order not to unnecessarily obscure the present invention.

A programmable integrated circuit, such as a programmable logic device (PLD) provides logic functions, which are typically realized by hardware lookup tables (LUT), circuitry in the PLD. Each LUT consists of a group of CRAMs, multiplexers, and drivers. In a complex system on PLD chip (SOPC) design if there are demands for more memory resources then the LUTs on the PLD, many LUT circuits are idle as well as their associated CRAMs. Through the embodiments described herein, the CRAM architecture is converted to be a user accessible memory block inside a LUT circuit, and the PLD can have extra memory resources when logic elements are not in use. Furthermore, the embodiments described herein provide for a scalable LUT-based memory architecture, which supports all features of CRAM and SRAM, such as configuration, error detection, CRAM and memory writes.

Figure 1:
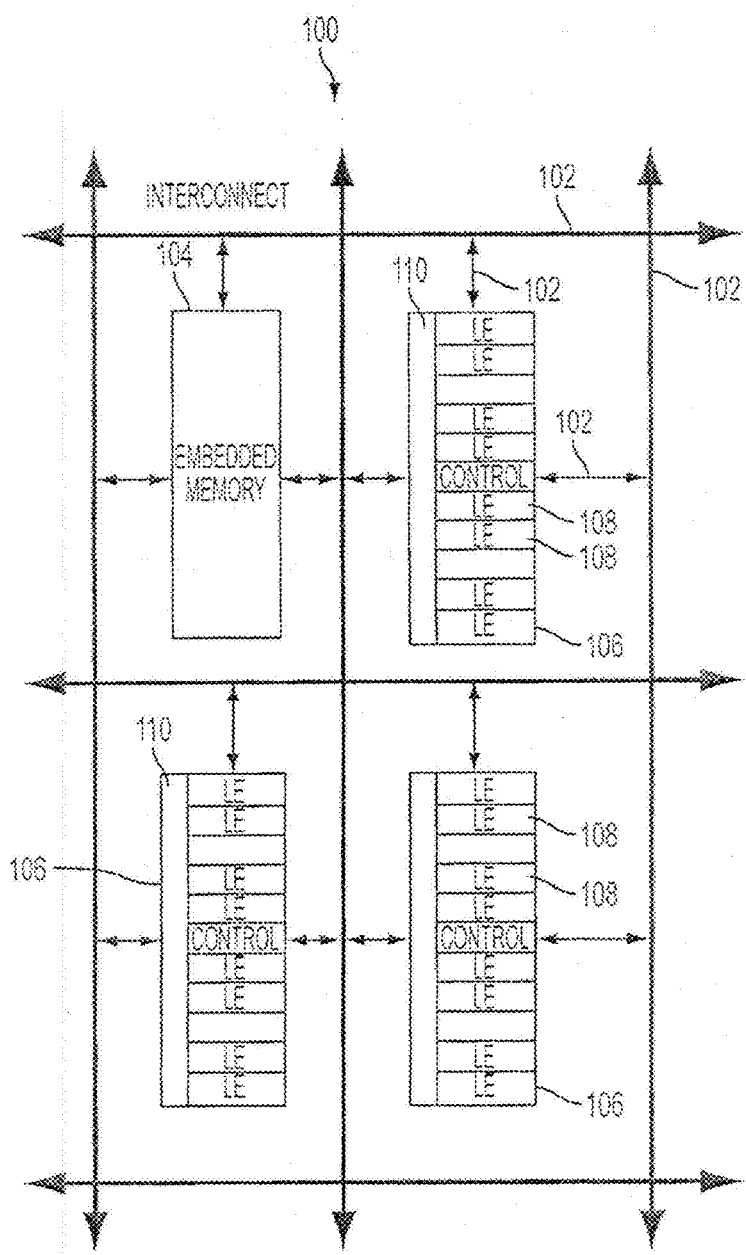
FIG. 1 is a simplified schematic diagram of an interconnect layout for logic blocks of a programmable logic device with an embedded memory in accordance with one embodiment of the invention.

FIG. 1 is a simplified schematic diagram of an interconnect layout tor logic blocks of a programmable logic device with an embedded memory in accordance with one embodiment of the invention. Programmable logic device 100 includes routing circuitry 102, which distribute signals through the different blocks within the programmable logic device. Embedded memory 104 is distributed throughout the programmable logic device, as well as logic array blocks 106. It should be appreciated that some of the logic blocks may not be utilized depending on the customer's application. The embodiments described herein enable conversion of some of logic blocks 106 to be utilized as memory as described in further detail below. As a high level description, logic array blocks 106 include a plurality of logic elements 108. The logic elements communicate with each other through internal interconnect structure 110. The logic element's look up tables (LUT) contain logic gates and perform some functionality depending on the configuration for the PLD. The input and output signals of embedded memory 104, e.g., address, data, and/or control signals, are generated from routing circuitry 102, i.e., the global PLD interconnect. It should be appreciated that the signals are created separately from the input/output connections for the logic elements in the logic array blocks 106. That is, the LUT based memory block is physically created inside a logical array block and shares the input and the output signals with the LAB. The embodiments described below provide for a LUT-based memory with no extra costs of interconnects on top of a logical array block, as all signals that support the configurable memory need no additional routing from the interconnect structure. Further details on the architecture of logic array bocks mm be found m U.S. Pat. No. 5,260,610, which is incorporated herein by reference for all purposes.

Figure 2:
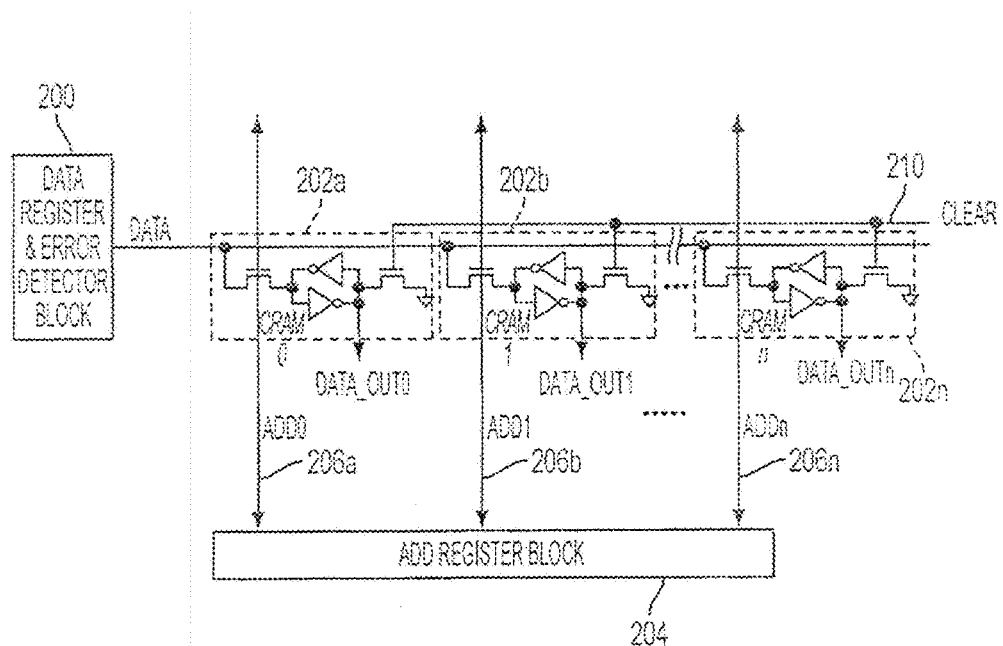
FIG. 2 is a simplified schematic diagram illustrating the components of a CRAM array architecture.

FIG. 2 is a simplified schematic diagram illustrating the components of a CRAM array architecture. Memory elements, also referred to as storage elements, 202*a* through 202*n* are provided to store a configuration for the PLD. Data register and error detection block 200 provides the configuration data into each of storage elements 202*a* through 202*n*. Within each storage element 202*a* through 202*n* includes storage circuitry such as the illustrated cross coupled inverters disposed between two transistors. Address register block 204 provides a signal to open and close a gate for a corresponding transistor enabling access into a storage element. For example, ADD0 will enable access to storage element 202*a* through a corresponding transistor. It should be appreciated that while a single row of storage elements 202*a* through 202*n* are illustrated in FIG. 2, multiple rows may be provided in order to define a memory array. Input data of the CRAM array is labeled as DATA in FIG. 2 and remains as a logical high signal when the CRAM cells are not in use. Prior to the loading of the configuration of the CRAM, a CLEAR signal is set high and initializes each of the DATA_OUT nodes (DATA_OUT0 through DATA_OUTn) in the CRAM cells to a logical low value. Address register block 204 includes logic that sequentially turns on each storage element of the corresponding row one by one. Data register and error detection block 200 drives the DATA line to a logical low value if the corresponding CRAM cell needs to flip the respective DATA_OUT node to a logical high value. Once the configuration operation is complete, the CRAM sustains the data intact until power is turned off. In order to prevent any possible data corruption, the CRAM architecture of FIG. 2 supports error detection, which allows the data to be read back from the CRAM cells so that error detection may be performed through data register and error detection block 200. As a result, all written data into storage elements 202*a* through 202*n* can be verified and corrected if any mismatch is found.

Figure 3:
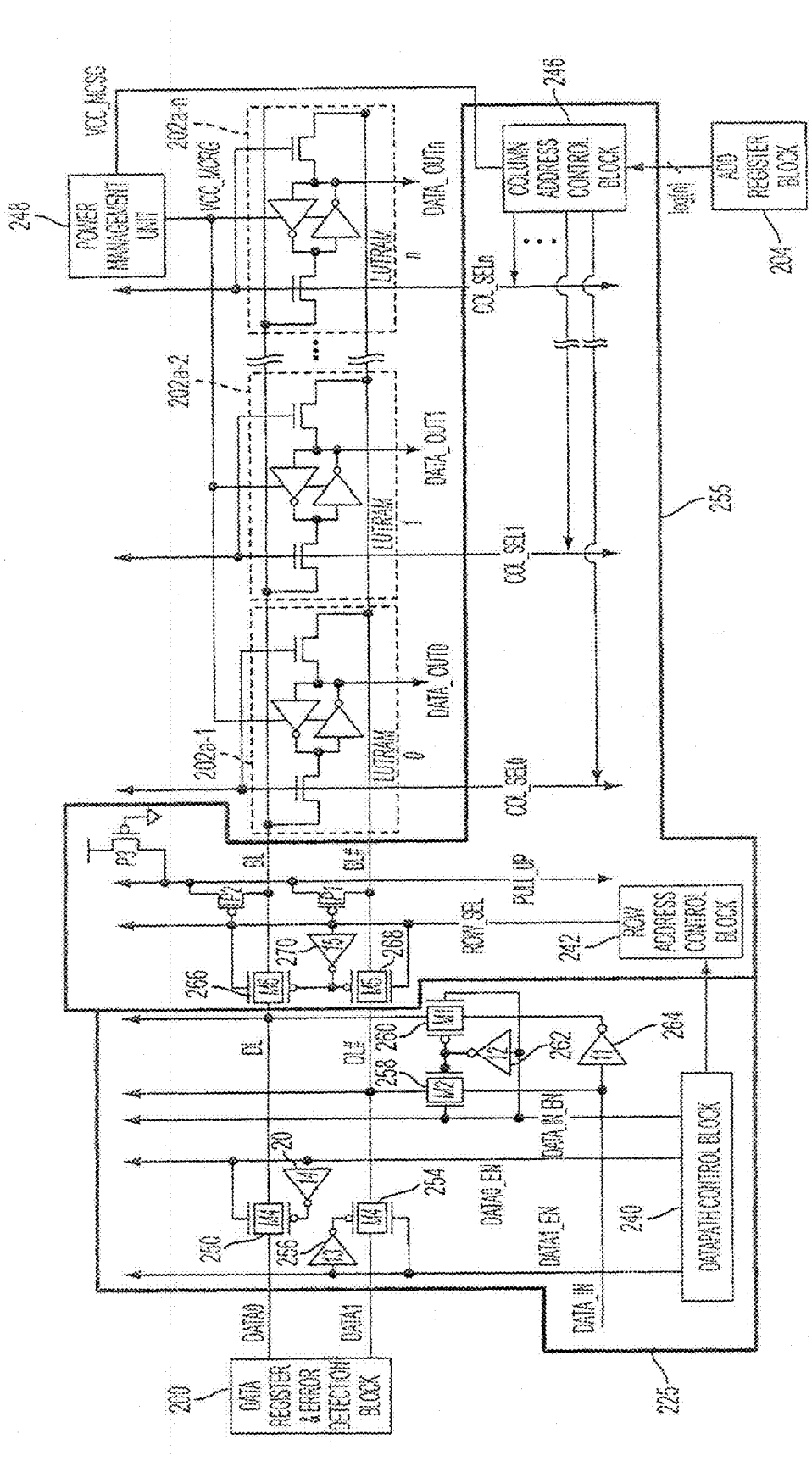
FIG. 3 is a simplified schematic diagram illustrating the architecture for enabling the storage elements to be convertible between a static random access memory cell and a configuration random access memory cell in accordance with one embodiment of the invention.

FIG. 3 is a simplified schematic diagram illustrating the architecture for enabling the storage elements to be convertible between a static random access memory cell and a configuration random access memory cell in accordance with one embodiment of the invention. The LUT-based memory cell of FIG. 3 includes data register and error detection block 200, power management unit 248, data control and multiplexer block 225, row address and column address multiplexing block 255, in addition to memory cells 202*a* through 202*n*. Accordingly, data control and multiplexing block 225, row address and column address multiplexing block 255 and power management unit 248 are additional circuits supplied in order to enable the convertibility between SRAM cells and CRAM cells tor storage cells 202*a* through 202*n*. Storage ceils 202*a* through 202*n* include a pair of data lines, a bit line (BL) and an inverted bit line (BL#) instead of a single data line as illustrated in FIG. 2. Each corresponding storage cell 202*a* through 202*n* provides a DATA_OUT signal. Within each storage cell 202*a* through 202*n* are cross coupled inverters disposed between transistors. Data register and error detection block 200 is in communication with the storage elements of the memory array through a pair of data lines, DATA0 and DATA1. Data lines, DATA0 and DATA1 provide configuration data when the corresponding storage elements 202*a* through 202*n* are utilized as CRAM cells. DATA_IN signal provides data to a pair of corresponding lines in order to provide data to be input into storage cells 202*a* through 202*n* when the storage cells are configured as SRAM cells. Data path control block 240 provides control signals that will configure the LUT-based memory array as either a CRAM cell or SRAM cell. For example, when loading a configuration, data path control block 240 provides a logical high signal over the DATA1_EN signal line, a logical high value over the DATA0_EN signal line and a logical low value over the DATA_IN_EN signal line. In this manner, the logical high value will open complimentary metal oxide semiconductor (CMOS) multiplexer 254 as the NMOS transistor on one side of multiplexer 254 receives a logical high value and the PMOS transistor receives a logical low value, which was inverted through inverter 256. Similarly, multiplexer M4 250 is open to select, or to allow DATA0 therethrough as the logical high value on the DATA0_EN signal line provides a logical high value to NMOS transistor of CMOS multiplexer 250 and a logical low value which was inverted through inverter 252 to a PMOS transistor of multiplexer 250. Thus, DATA0 and DATA1 will pass through corresponding multiplexers 250 and 254 to signal lines DL and DL#. The logical low value over DATA_IN_EN closes corresponding multiplexers 258 and 260. That is, the logical low value supplied to the corresponding NMOS transistors of multiplexers 258 and 260, as well as the logical high value supplied through inverter 262 to corresponding PMOS transistors of multiplexers 258 and 260, close the multiplexers.

Further data path flows are available by manipulating the control logic from data path control block 240 as illustrated with reference to Table I below. As illustrated in Table I through the different values for the corresponding control signals, the memory array may be converted between a configuration mode, an error detection mode, CRAM mode, and an SRAM mode.

TABLE I

| | DATA1_EN | DATA0_EN | DATA_IN_EN | Data Flow |
|---|---|---|---|---|
| Configuration | 1 | 1 | 0 | DATA0/DATA1->BL/BL# |
| Error Detection | 0 | 1 | 0 | BL->DATA0 |
| CRAM mode | 0 | 0 | 0 | None |
| SRAM mod | 0 | 0 | 1 | DATA_IN->BL/BL# |

Row address and column address multiplexing block 255 includes CMOS multiplexers 266 and 268, which provide access into the corresponding row of the memory array. Thus, depending on the state of the select signals, i.e., the logical values provided to the transistors, provided to multiplexers 250, 254, 258, and 260, the data written into the corresponding storage cells 202a through 202n is determined through the mode specified by the control signals of data path control block 240. Row address control block 242 provides a signal that controls multiplexer 266 and multiplexer 268. In addition, ROW_SEL signal line provides a signal to PMOS transistors P1 and P2. Transistors P1 and P2 enable access between corresponding bit lines and PULL_UP signal line. The PULL_UP signal line is also in communication with PMOS transistor P3, which has its corresponding gate connected to ground. It should be appreciated that PMOS transistors P1, P2 and P3 may be used for BL and BL# precharging operations which maintain stability of the LUTRAM data. It should be further appreciated that PULL_UP is a common source node in the precharge circuitry, which works as a voltage equalizer between BL and BL#, while the ROW_SEL signal is disabled. Address register block 204 provides input to column address control block 246. Column address control block 246 provides column select signals for corresponding columns within the memory array.

As illustrated in FIG. 3, in order to allow the LUTRAM to support both CRAM and SRAM functions, there are two pairs of data lines and each pair has its dedicated control signal. That is, the two pairs of data lines are multiplexed into the bit lines of the memory array through corresponding dedicated multiplexers. The two data lines for CRAM operation include DATA0 to DL, and DATA1 to DL#. The signal over DATA0 is enabled through multiplexer 250, while the signal over DATA1 is enabled through multiplexer 254. The data lines for the SRAM operation are provided through DATA_IN to DL through inverter 264 and multiplexer 260, and through DATA_IN to DL# through multiplexer 258. It should be appreciated that due to large wire loading on BL, BL#, DATA0 and DATA1 lines, it becomes a challenge to keep the size of the LUTRAM cells to a minimum while the silicon geometry is shrinking. The embodiments described herein utilize power management unit 248 to adjust the voltage level to the corresponding LUTRAM cell and the column address control block which controls the column select signals. The voltage level of the power supply to the LUTRAM cells, in particular the inverters of each cell, is referred to as VCC_MCRG. The power supply to the column select signals for corresponding transistors enabling access to the storage elements of the array is referred to as VCC_MCSG. It should be appreciated that in one embodiment, the four modes of operation require different voltage levels. The different voltage levels for VCC_MCRG and VCC_MCSG are listed in Table II for each of the different memory operation modes. In one embodiment, the normal VCC level is approximately 1.1 volts, while the over-driven VCC level is approximately 1.6 volts. One skilled in the art will appreciate that the different voltage levels are provided in order to enable the error detection feature. In addition, the approximate voltage levels mentioned above are exemplary and not meant to be limiting, as different voltage levels may be possible depending on the application/architecture.

TABLE II

| | VCC_MCRG | VCC_MCSG |
|---|---|---|
| Configuration | Normal VCC | Over-driven VCC |
| Error Detection | Over-driven VCC | Normal VCC |
| CRAM mode | Over-driven VCC | Normal VCC |
| SRAM mode | Nomal VCC | Over-driven VCC |

Figure 4:
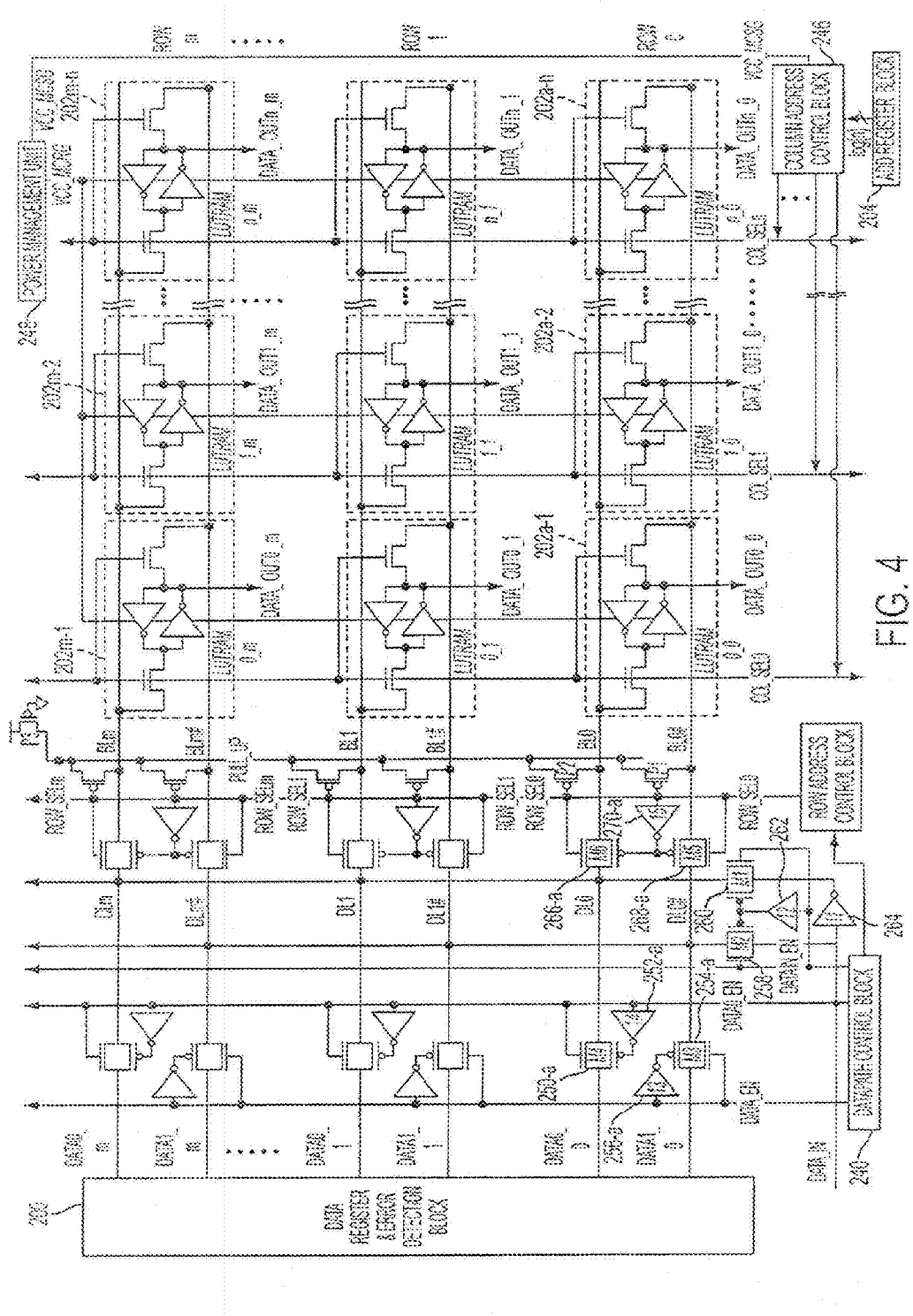
FIG. 4 is a simplified schematic diagram illustrating the configuration for multiple rows of the memory array depicted tor a single row of FIG. 3 in accordance with one embodiment of the invention.

FIG. 4 is a simplified schematic diagram illustrating the configuration for multiple rows of the memory array depicted for a single row of FIG. 3 in accordance with one embodiment of the invention. In FIG. 4, the array includes M rows and N columns. As illustrated, PULL_UP line includes two PMOS transistors for each row and a third corresponding PMOS transistor, shared by each of the pairs, wherein the gate of the third PMOS is connected to ground. Data Register and error detection block provides M pairs of DATA0 and DATA1 lines. Row Address Control Block 242 generates M-bit wide ROW_SEL signal bus, one associated with a row. The entire ROW_SEL bus is enabled during the Configuration or the Error Detection, which allows all M rows of SRAM to be simultaneously programmed during the Configuration or read back during the Error Detection. The output of multiplexer 258 connects to all DL# lines and the output of multiplexer 260 to all DL lines. During the write operation of SRAM mode, the DATA_IN_EN is on (listed in Table I) but only one of ROW_SEL signals is enabled to allow DATA_IN drives only one corresponding row. Each of the pairs of lines is multiplexed with a pair of DATA_IN lines. Multiplexing circuitry in conjunction with the data path control block enable access into the array of storage elements depending on the mode the array is being operated under. Within row 0, the circuitry has been labeled to correspond with the circuitry listed in FIG. 3 so that the architecture can be appreciated for the entire memory array. That is, the multiplexers and inverters for row 0 have callout numbers similar to FIG. 3 with an "a" appended to the end to correlate to row 0. Power management unit 248 manages the power supplied for VCC_MCRG and VCC_MSRG. Varying power levels may be supplied as required by the mode of operation and as listed in Table II.

Figure 5:
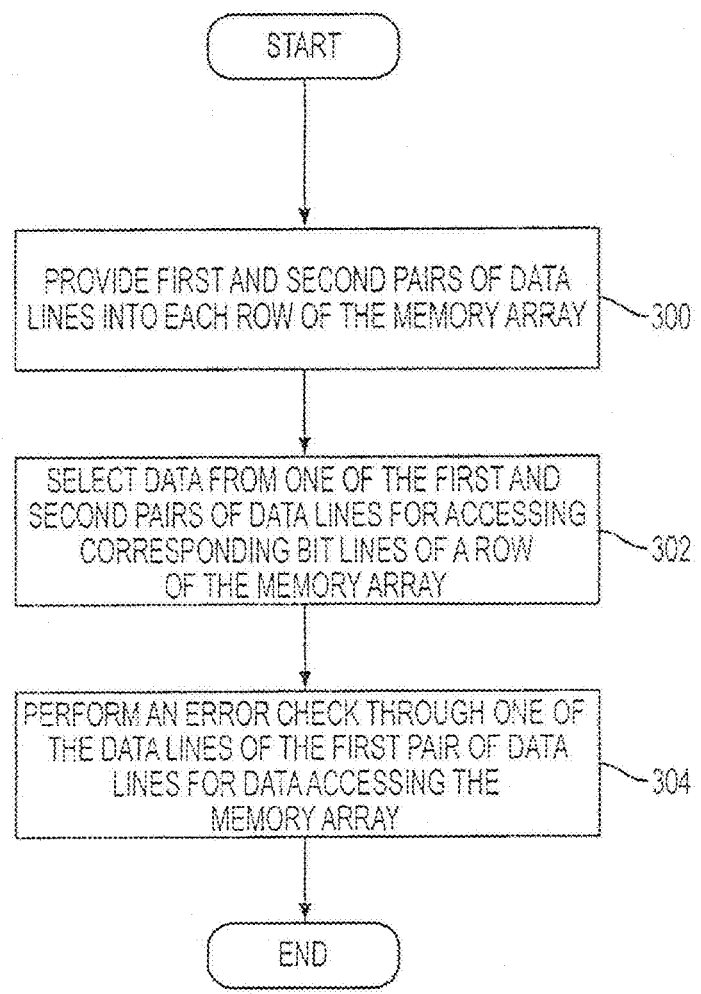
FIG. 5 is a flow chart diagram illustrating the method operations for selectively configuring a memory array within a programmable logic device in accordance with one embodiment of the invention.

FIG. 5 is a flow chart diagram illustrating the method operations for selectively configuring a memory array within a programmable logic device in accordance with one embodiment of the invention. The method initiations with operation 300 where first and second pairs of data lines are provided into each row of the memory array. It should be appreciated that the data lines from the data register and error detection block as well as the DATA_IN lines are provided to each row of the memory array depending on the configuration selected. As mentioned above, the two pairs of lines are multiplexed into the array. The method advances to operation 302 where one of the first and second pairs of data lines for accessing corresponding bit lines of the row of the memory array are selected. As described above with regard to FIG. 3, the control signals from, the data path control block will determine which signals are passed through the corresponding multiplexers to access the memory array. The method then advances to operation 304 where an error check Is performed through one of the data lines of the first, pair of dam lines for the data accessing the memory array. It should be noted that access to a single line is sufficient when performing error detection. Thus, the BL find corresponding DL lines may be used to provide the data to the data register and error detection block in order to determine if there has been any errors. In addition, the power provided to the memory elements and the column address control block may be adjusted based on the configuration mode under which the memory array is being operated. An mentioned above, the memory data path can be precharged through a common source as described with reference to the PULL_UP line of FIGS. 3 and 4.

Figure 6:
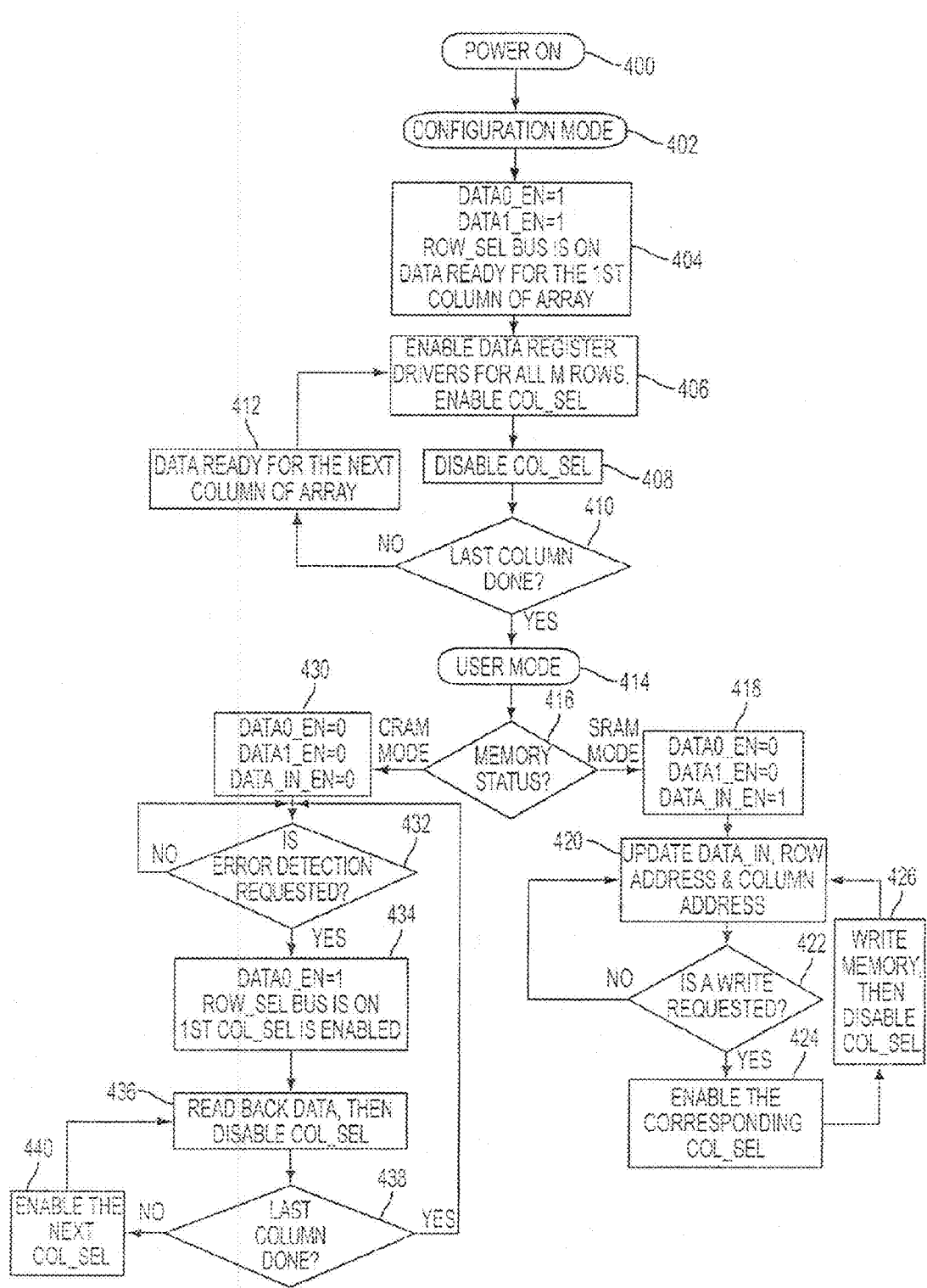
FIG. 6 is a flowchart diagram illustrating further details for operating a scalable LUT based memory in accordance with one embodiment of the invention.

FIG. 6 is a flowchart diagram illustrating further details for operating a scaleable LUT based memory in accordance with one embodiment of the invention. The method initiates with the integrated circuit, e.g., a programmable logic device powering up in operation 400. The integrated circuit is initialized in configuration mode in operation 402. In operation 404, the DATA0_EN and DATA1_EN signals are set to a logical high value. The ROW_SEL bus is also asserted and Data is ready for the first column of the memory array. In operation 406, data register drivers for all M rows are enabled. In addition the COL_SEL signal is also enabled. In operation 408 the COL_SEL signal is disabled and the method proceeds to decision operation 410 where it is determined if the last column was done. If the last column was not done, the method advances to operation 412 where Data is ready for the next column of the array. The method then proceeds to operation 406 and proceeds as described above to enter the data into the array. When the data has been entered into die last column in operation 410, the method proceeds to operation 414 where the integrated circuit enters user mode.

Upon entering user mode, it is determined whether to operate the memory in CRAM mode or SRAM mode in decision operation 416 of FIG. 6. If it is determined to operate the memory in SRAM mode, the method moves to operation 418 where the DATA0_EN, DATA1_EN, and DATA_IN_EN signals are set to the corresponding values for operation as an SRAM. In operation 420, DATA_IN, row address and column address parameters are updated. Then, in decision operation 422 it is determined whether a write is requested. If a write is not requested, then the method returns to operation 420 and repeats as described above. If a write is requested, then the method advances to operation 424 where the corresponding COL_SEL line is enabled. In operation 426, the data is written to the memory and the COL_SEL line is disabled.

If the memory is to be operated in CRAM mode as determined through operation 416 of FIG. 6, then the method proceeds to operation 430 where the DATA0_EN, DATA1_EN, and DATA_IN_EN signals are set to the corresponding values for operation as an CRAM. In decision operation 432 it is determined if error detection is requested. If error detection is not requested, the method continues checking. If error detection is requested, the method advances to operation 434 where DATA0_EN is set to a logical high value, ROW_SEL bus is on and a $1^{st}$ COL_SEL is enabled. In operation 436 the data is read back from the cell and the corresponding COL_SEL is disabled. In decision operation 438, it is determined if the. last column was done. If the last column was not done, the method advances to operation 440 the next COL_SEL signal is enabled and the method proceeds to operation 436 and repeats as described above. If the last column was done, the method moves to operation 432 and repeats as described above.

In summary the embodiments described above for the scalable LUT-based memory array enables support for both CRAM and SRAM operations. In addition, the embodiments allow a logic element to be configured either as a logic LUT or a small memory block. The LUTRAM cell maintains the same layout size as the CRAM cell on the PLD and the memory layout can share the same database with small routine differences as described with reference to the figures above. One skilled in the art will appreciate that the modular design associated with the embodiments describe herein enable the increase or decrease of row and/or columns by a multiple factor of two. In addition, the control logic is shamble by multiple rows and columns of the LUTRAM array.

The embodiments, thus far, were described with respect to PLDs. The method and apparatus for in-system programmability, described herein may be incorporated into any suitable circuit. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment the programmable logic device may be the STRATIX® III devices owned by the assignee.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A programmable integrated circuit device comprising:
a plurality of embedded memory blocks for use as user memories in accordance with a user configuration of said programmable integrated circuit device;
a plurality of logic blocks for performing logic functions in accordance with said user configuration of said programmable integrated circuit device; and
programmable routing circuitry for programmably distributing signals among said logic blocks and said embedded memory blocks; wherein:
at least one logic block in said plurality of logic blocks comprises a plurality of programmable logic elements, and a programmable interconnect structure for programmably distributing signals among said logic elements in accordance with a user configuration of said programmable integrated circuit device;
each logic element in said plurality of logic elements comprises a plurality of storage elements; and
said at least one logic block further comprises control circuitry that determines when said plurality of storage elements functions as configuration memory for said logic element and when said plurality of storage elements functions as additional user memory.

2. The programmable integrated circuit device of claim 1 wherein said control circuitry selectably provides for operation of said plurality of storage elements in a mode selected from the group consisting of:
a mode in which a configuration for said programmable integrated circuit device is loaded into said plurality of storage elements;
a mode in which said configuration controls operation of said logic element;
an error detection mode; and
a mode in which said plurality of storage elements operates as said additional user memory.

3. The programmable integrated circuit device of claim 1 wherein said control circuitry provides for addressing of each individual storage element in said plurality of storage elements when said plurality of storage elements functions as said additional user memory.

4. The programmable integrated circuit device of claim 3 wherein said control circuitry comprises row address control circuitry and column address control circuitry.

5. The programmable integrated circuit device of claim 3 further comprising multiplexing circuitry for determining when said plurality of storage elements functions as configuration memory for said logic element and when said plurality of storage elements functions as additional user memory.

6. The programmable integrated circuit device of claim 5 wherein:
said plurality of storage elements for each said logic element in said plurality of logic elements comprises a row of said storage elements, whereby there are a plurality of said rows of said storage elements; and
said multiplexing circuitry multiplexes output of each of said rows from one of a first pair of data paths or a second pair of data paths.

7. The programmable integrated circuit device of claim 6 further comprising a power management unit for adjusting a voltage level supplied to said plurality of storage elements based on whether said plurality of storage elements function as said configuration memory or said additional user memory.

8. The programmable integrated circuit device of claim 7 wherein said power management unit supplies a higher voltage to said plurality of storage elements when said plurality of storage elements functions as said configuration memory.

9. The method of claim 7 wherein said adjusting comprises supplying a higher voltage to said plurality of storage elements when said plurality of storage elements functions as said configuration memory.

10. The programmable integrated circuit device of claim 3 wherein said control circuitry comprises error detection circuitry.

11. A method of operating a programmable integrated circuit device having a plurality of embedded memory blocks for use as user memories in accordance with a user configuration of said programmable integrated circuit device, a plurality of logic blocks for performing logic functions in accordance with said user configuration of said programmable integrated circuit device, and programmable routing circuitry for programmably distributing signals among said logic blocks and said embedded memory blocks, wherein at least one logic block in said plurality of logic blocks comprises a plurality of programmable logic elements and a programmable interconnect structure for programmably distributing signals among said logic elements in accordance with said user configuration of said programmable integrated circuit device, and wherein each logic element in said plurality of logic elements comprises a plurality of storage elements; said method comprising:
controlling said plurality of storage elements to function as configuration memory for said logic element or as additional user memory.

12. The method of claim 11 wherein said controlling comprises selectably operating of said plurality of storage elements in a mode selected from the group consisting of:
a mode in which a configuration for said programmable integrated circuit device is loaded into said plurality of storage elements;
a mode in which said configuration controls operation of said logic element;
an error detection mode; and
a mode in which said plurality of storage elements operates as said additional user memory.

13. The method of claim 11 wherein said controlling comprises addressing of each individual storage element in said plurality of storage elements when operating said plurality of storage elements as said additional user memory.

14. The method of claim 13 wherein said addressing comprises addressing said plurality of storage elements by row and by column.

15. The method of claim 11 wherein:
said plurality of storage elements for each said logic element in said plurality of logic elements comprises a row of said storage elements, whereby there are a plurality of said rows of said storage elements; and
said controlling comprises multiplexing output of each of said rows from one of a first pair of data paths or a second pair of data paths.

16. The method of claim 15 wherein said controlling comprises detecting errors on said data paths.

17. The method of claim 11 further comprising adjusting a voltage level supplied to said plurality of storage elements based on whether said plurality of storage elements function as said configuration memory or said additional user memory.

18. A programmable integrated circuit device comprising:
an embedded memory block accessible as random access memory in accordance with a configuration program of the programmable integrated circuit device; and
a logic block configurable to perform a logic function in accordance with the configuration program of the programmable integrated circuit device, wherein the logic block comprises a programmable logic element that comprises a storage element, and wherein the logic block comprises control circuitry that determines when the storage element functions as configuration memory of the logic element and when the storage element functions as an additional random access memory.

19. The programmable integrated circuit device of claim 18, comprising programmable routing circuitry that programmably distributes one or more signals between the logic block and the embedded memory block.

20. The programmable integrated circuit device of claim 18, wherein the control circuitry comprises error detection circuitry.

* * * * *